(12) United States Patent
Bachhuber

(10) Patent No.: US 11,050,418 B2
(45) Date of Patent: Jun. 29, 2021

(54) GATE LEVEL TRIGGERED DESATURATION BLANKING

(71) Applicant: Infineon Technologies AG, Neubiberg (DE)

(72) Inventor: Marco Bachhuber, Neuried (DE)

(73) Assignee: Infineon Technologies AG, Neubiberg (DE)

( * ) Notice: Subject to any disclaimer, the term of this patent is extended or adjusted under 35 U.S.C. 154(b) by 265 days.

(21) Appl. No.: 16/246,336

(22) Filed: Jan. 11, 2019

(65) Prior Publication Data

US 2020/0228109 A1 Jul. 16, 2020

(51) Int. Cl.
*H03K 17/08* (2006.01)
*H03K 17/082* (2006.01)

(52) U.S. Cl.
CPC ..... *H03K 17/0822* (2013.01); *H03K 17/0828* (2013.01)

(58) Field of Classification Search
CPC .. H03K 17/08; H03K 17/082; H03K 17/0828; H03F 1/52; H02M 1/32
See application file for complete search history.

(56) References Cited

U.S. PATENT DOCUMENTS

| | | | | |
|---|---|---|---|---|
| 5,687,049 A | * | 11/1997 | Mangtani | H02H 7/1227 361/18 |
| 6,097,582 A | * | 8/2000 | John | H03K 17/165 361/79 |
| 2008/0304189 A1 | * | 12/2008 | Tang | H02H 7/0838 361/33 |
| 2013/0293988 A1 | * | 11/2013 | Li | H02H 3/165 361/30 |
| 2014/0001988 A1 | * | 1/2014 | Kanzaki | B60L 58/12 318/400.3 |
| 2015/0085403 A1 | * | 3/2015 | Santos | H02H 7/0822 361/33 |
| 2015/0326009 A1 | * | 11/2015 | Mari Curbelo | H03K 17/168 363/50 |
| 2019/0326845 A1 | * | 10/2019 | Pokkinen | H02M 7/5387 |
| 2020/0244265 A1 | * | 7/2020 | Paganini | H03K 19/00369 |

OTHER PUBLICATIONS

Texas Instruments Inc., TI Designs: TIDA-01605 "Automotive Dual-Channel, SiC MOSFET Gate Driver Reference Design With Two-Level Turnoff Protection," TIDUE55, Mar. 2018, 33 pages.
EiceDRIVERTM, SIL, High Voltage IGBT Driver for Automotive Applications, 1EDI2002AS, Single Channel Isolated Driver for Inverter Systems, Hardware Description, Rev. 3.1, Jul. 30, 2015, 147 Pages.

* cited by examiner

*Primary Examiner* — Adolf D Berhane
(74) *Attorney, Agent, or Firm* — Slater Matsil, LLP

(57) ABSTRACT

A method of operating a power switch driver circuit coupled to a power switch includes producing, by a controller of the power switch driver circuit, a first driving signal to a control terminal of the power switch to turn on the power switch; comparing, by a first comparator of the power switch driver circuit, a first voltage at the control terminal of the power switch with a first pre-determined threshold; and starting monitoring a desaturation condition of the power switch a pre-determined period of time after detecting that the first voltage is above the first pre-determined threshold, wherein monitoring the desaturation condition comprises monitoring a second voltage at a load path terminal of the power switch.

22 Claims, 7 Drawing Sheets

GATE LEVEL TRIGGERED DESATURATION BLANKING

TECHNICAL FIELD

This disclosure relates in general to electronic circuits and systems, and, in particular, to circuits and methods for desaturation detection in a power system.

BACKGROUND

A power system may include a power control circuit, a plurality of power switches (e.g., metal-oxide-semiconductor field-effect transistors (MOSFETs), silicon carbide (SiC) MOSFETs, or insulated-gate bipolar transistors (IGBTs)) coupled to and controlled by the power control circuit, and a load (e.g., a motor) coupled to and driven by the power switches.

The power control circuit may include a power management circuit, a driver circuit, control logic, diagnostic logic, or other circuits. The power management circuit may be used for generating and/or regulating power supply voltages. The control logic may include a micro-controller that monitors and controls the operation of the power system. A motor driver can have a controller that generates a pulse-width modulated (PWM) signal used to produce drive signals for the power switches for different phases of the motor.

Power control circuits may be implemented on semiconductor substrates as integrated circuit (IC) chips, such as power control ICs (may also be referred to as gate drivers, gate driver circuit, power switch driver circuit, or gate driver ICs). Due to the small footprint and energy efficiencies of gate driver ICs, gate driver ICs are widely used in various applications and products across different industries, e.g., such as consumer electronics, industrial control, medical equipment, aviation, and automotive.

SUMMARY

In accordance with an embodiment of the present invention, a method of operating a power switch driver circuit coupled to a power switch includes producing, by a controller of the power switch driver circuit, a first driving signal to a control terminal of the power switch to turn on the power switch; comparing, by a first comparator of the power switch driver circuit, a first voltage at the control terminal of the power switch with a first pre-determined threshold; and starting monitoring a desaturation condition of the power switch a pre-determined period of time after detecting that the first voltage is above the first pre-determined threshold, wherein monitoring the desaturation condition comprises monitoring a second voltage at a load path terminal of the power switch.

In accordance with an embodiment of the present invention, a power switch driver circuit includes a driver circuit configured to be coupled to a control terminal of a power switch and drive the power switch; and a desaturation detection circuit coupled to the driver circuit, the desaturation detection circuit includes a first comparator configured to compare a first reference voltage with a first voltage at the control terminal of the power switch; and a timer coupled to the first comparator and configured to start counting a pre-determined period of time when the first comparator detects that the first voltage is above the first reference voltage, wherein the desaturation detection circuit is configured to detect a desaturation condition of the power switch, wherein the desaturation detection circuit is further configured to be disabled before the timer finishes counting the pre-determined period of time and enabled after the timer finishes counting the pre-determined period of time.

In accordance with an embodiment of the present invention, a gate driver integrated circuit includes a driver circuit having an output terminal configured to be coupled to a control terminal of a power switch; a first comparator having a first input terminal configured to be coupled to the control terminal of the power switch, and a second input terminal coupled to a first reference voltage node configured to receive a first reference voltage; a timer coupled to an output terminal of the first comparator and configured to count a pre-determined duration when a voltage at the control terminal of the power switch is above the first reference voltage; a second comparator having a first input terminal coupled to a second reference voltage node configured to receive a second reference voltage, and a second input terminal configured to be coupled to a load path terminal of the power switch; and a clamping circuit coupled to the second input terminal of the second comparator.

BRIEF DESCRIPTION OF THE DRAWINGS

For a more complete understanding of the present invention, and the advantages thereof, reference is now made to the following descriptions taken in conjunction with the accompanying drawings, in which.

Corresponding numerals and symbols in different figures generally refer to corresponding parts unless otherwise indicated. The figures are drawn to clearly illustrate the relevant aspects of the disclosed embodiments and are not necessarily drawn to scale.

DETAILED DESCRIPTION OF ILLUSTRATIVE EMBODIMENTS

The making and using of the presently disclosed embodiments are discussed in detail below. It should be appreciated, however, that the present invention provides many applicable inventive concepts that can be embodied in a wide variety of specific contexts. The specific embodiments discussed are merely illustrative of specific ways to make and use the invention, and do not limit the scope of the invention.

The present invention will be described with respect to an embodiment in a specific context, namely gate driver circuit with a desaturation detection circuit and methods of operating the gate driver circuit with the desaturation detection circuit.

In embodiments of the present invention, the desaturation blanking time of a desaturation detection circuit is adjusted automatically for different load conditions, by starting a timer with a pre-determined duration $t_{BLANC}$ after the gate-source voltage $V_{DS}$ of a power switch rises above a pre-determined threshold $V_{BLANC}$. In some embodiments, the pre-determined duration $t_{BLANC}$ and the pre-determined threshold $V_{BLANC}$ have fixed values that remain the same regardless of the load conditions. After the timer expires, the voltage at a load path terminal of the power switch is monitored. The desaturation detection circuit detects a desaturation condition when the voltage at the load path terminal of the power switch is above a pre-determined threshold $V_{DESAT}$.

Figure 1:
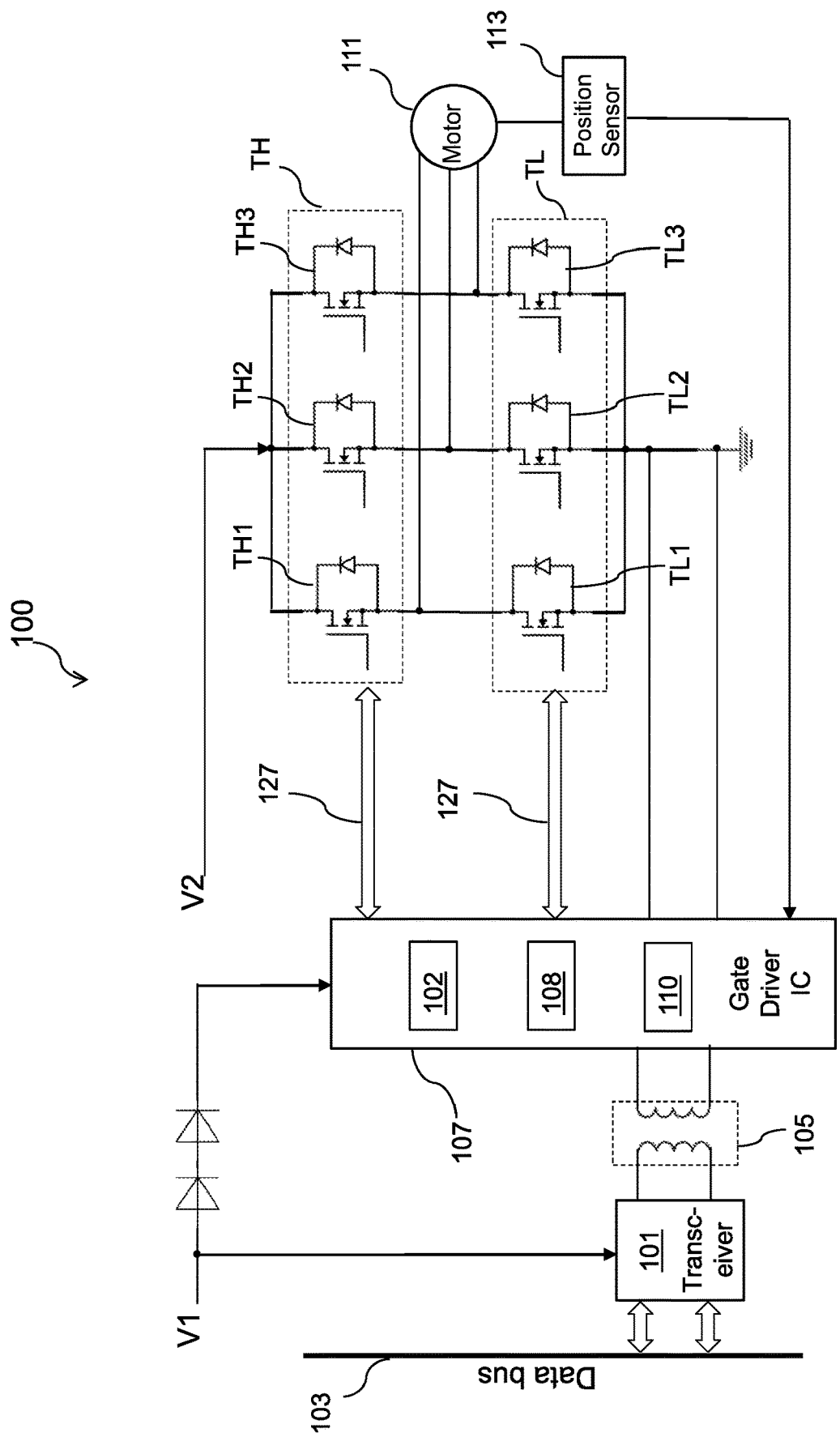
FIG. 1 illustrates a block diagram of a power system, in an embodiment.

FIG. 1 illustrates a block diagram of a power system 100, in an embodiment. In particular, FIG. 1 illustrates an example application where the power system 100 is used for controlling a three-phase motor 111. The power system 100 may be used, for example, to operate an electronic power steering system or a power brake system in an automobile. The three-phase motor application is merely a non-limiting example, as embodiment systems and methods disclosed herein may be applied to other applications besides the illustrated motor applications. In addition, one of ordinary skill in the art would appreciate that other connections and other functional blocks may exist within the power system 100 of FIG. 1. For clarity, not all features of the power system 100 are illustrated in FIG. 1.

As illustrated in FIG. 1, the power system 100 includes a gate driver IC 107, power switches (e.g., high side switches TH1, TH2, and TH3, and low side switches TL1, TL2, and TL3), and the three-phase motor 111. The gate driver IC 107 may be powered by a first power supply having voltage V1 (e.g., 12V), and the power switches may be powered by a second power supply having voltage V2 (e.g., 48V). For ease of discussion, the notation of TH may be used to refer to the high side power switches TH1, TH2, and TH3 collectively, and the notation of TL may be used to refer to the low side power switches TL1, TL2, and TL3 collectively. In addition, a notation of THx may be used to refer to one of the high side power switches (e.g., TH1, TH2, or TH3), and a notation of TLx may be used to refer to one of the low side power switches (e.g., TL1, TL2, or TL3). In the illustrated embodiment, each high side power switch THx and a corresponding low side power switch TLx form a half-bridge of the power system 100.

FIG. 1 further illustrates additional features, such as a position sensor 113 (for sensing the rotor positions of the three-phase motor 111), a transceiver 101, and a data bus 103 (e.g., a local interconnect network (LIN) bus). The gate driver IC 107 may communicate with the transceiver 101 via, e.g., a galvanic isolation device 105 (e.g., a transformer, or a capacitive galvanic device), and the transceiver 101 may communicate with another device via the data bus 103. Details of the gate driver IC 107 are discussed hereinafter with reference to FIG. 2.

Figure 2:
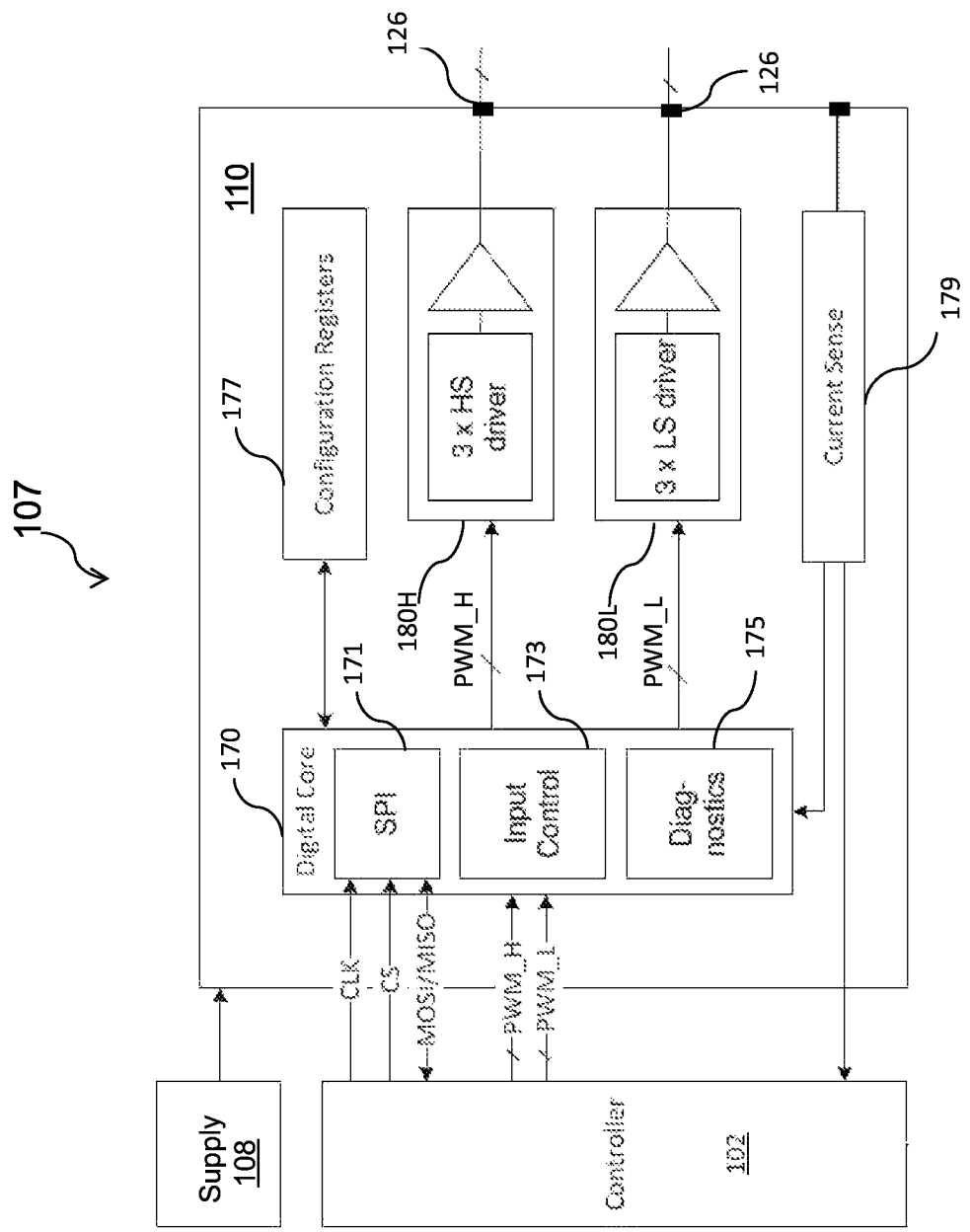
FIG. 2 is a block diagram of a gate driver IC, in an embodiment.

FIG. 2 illustrates a block diagram of an embodiment gate driver IC 107 that may be used in the power system 100 of FIG. 1. The gate driver IC 107 may include a plurality of modules, such as a supply module 108, a controller 102, and a pre-driver circuit no. The example illustrated in FIG. 2 is illustrative and not limiting; other gate driver ICs with other structures may also be used in the power system 100.

Referring to FIG. 2, the supply module 108 of the gate driver IC 107 may be a power management circuit used for generating and/or regulating power supply voltages for the pre-driver circuit no. The controller 102 may be a microprocessor, a central processing unit (CPU), an application specific integrated circuit (ASIC), or the like. In some embodiments, the controller 102 provides motor control via pulse width modulated (PWM) signals PWM_H and PWM_L based on feedback from the current sense block of the pre-driver circuit 110. The controller 102 can also operate as the bus master for the communication interface (e.g., a serial peripheral interface (SPI)).

The pre-driver circuit no has several logical blocks inside, such as a digital core block 170 comprising a communication interface 171 (e.g., an SPI bus interface), an input control logic 173, and a diagnostic logic 175. A feedback block 179, such as a current sense block, provides feedback information from the three-phase motor 111 through the pre-driver circuit no and back to the controller 102. Configuration registers 177 store configuration settings in the pre-driver circuit 110. The digital core block 170 produces two PWM signals (for the high side and low side power switches) for each of the three phases, totaling six PWM switching signals provided by way of three half-bridge drivers, with each half-bridge driver having two driver circuits 180 (e.g., 180H and 180L), such as a high side driver circuit 180H and a low side driver circuit 180L. The output (e.g., a gate control signal such as a gate control voltage) of each of the driver circuits 180 is sent to a respective output port 126 for controlling a corresponding power switch (e.g., a high side power switch THx, or a low side power switch TLx in FIG. 1) via data paths 127 (see FIG. 1). Each of the data paths 127 may include a plurality of conductive paths (e.g., copper lines) between the digital core block 170 and the power switches TH/TL, which conductive paths may carry control signals (e.g., gate driving signals) from the digital core block 170 to the power switches, and may also carry status information (e.g., gate voltages, drain voltages and source voltages of the power switches TH/TL) from the power switches TH/TL to the digital core block 170.

The power switches TH/TL may be any suitable switches, such as field effect transistors (FETs) (e.g., MOSFETs), SiC MOSFETs, insulated-gate bipolar transistor (IGBTs), or the like. The discussion herein may use MOSFETS as examples of the power switches TH/TL, with the understanding that any suitable power switches may be used. In addition, discussion herein may refer to the control terminal of a power switch as a gate, and may refer to the two load path terminals of each power switch as a drain and a source, with the understanding that terms such as the "gate," the "drain" and the "source" should be interpreted accordingly for different types of power switches used. For example, if IGBTs are used as the power switches, the "gate," the "drain" and the "source" in the discussion herein may be interpreted as the "base," the "collector," and the "emitter" of the IGBTs, respectively.

Figure 3:
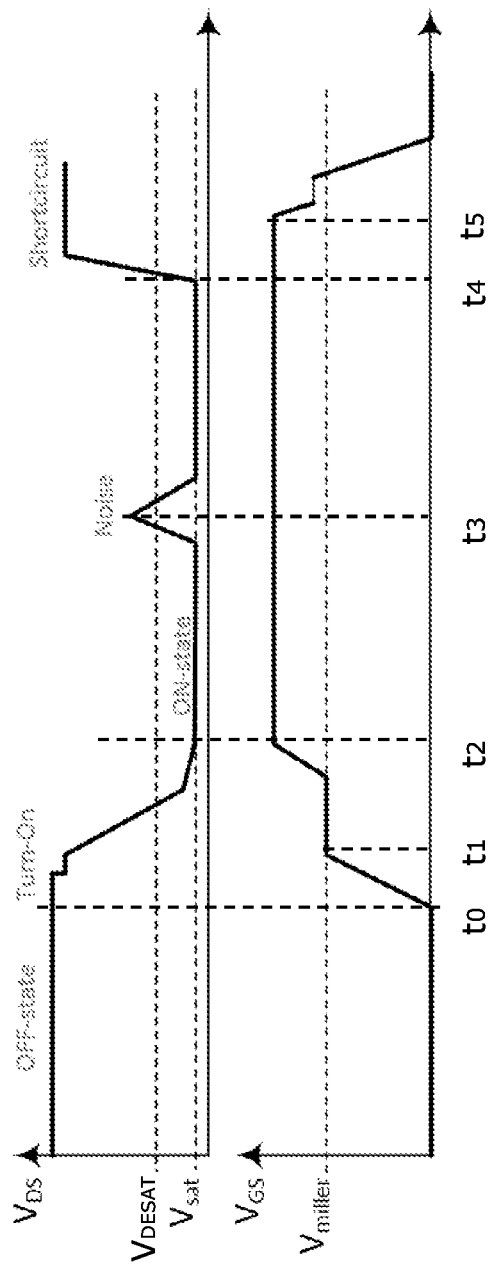
FIG. 3 illustrates the responses of the drain-source voltage and the gate-source voltage of a power switch in a power system, in an embodiment.

FIG. 3 illustrates responses for the drain-source voltage and the gate-source voltage of a power switch during a turn-on process and during a short circuit event, in an embodiment. The power switch may be any of the power switches TH/TL in FIG. 1. Without loss of generality, discussion herein with reference to FIG. 3 refers to the power switch as a low side switch TLx. FIG. 3 helps to understand the challenges of desaturation detection and the advantages of the presently disclosed embodiments.

Referring to FIG. 3, before time $t_0$, the power switch TLx is in an OFF state, the gate-source voltage $V_{GS}$ of the power switch TLx is low (e.g., 0 volt), and the drain-source voltage $V_{DS}$ of the power switch is high (e.g., 400 volt). At time $t_0$, the power switch TLx receives a gate control voltage from the controller 102 and starts to turn on. As a result, the gate-source voltage $V_{GS}$ starts to increase, and the drain-source voltage $V_{DS}$ starts to decrease during the turn-on process. At time $t_1$, the gate-source voltage $V_{GS}$ reaches Miller voltage $V_{miller}$ and charges the Miller capacitance of the power switch TLx, and the gate-source voltage $V_{GS}$ plateaus for a while then continues to rise. At time $t_2$, the power switch TLx is fully turned on and enters the ON-state (also referred to as a saturation state). In the ON-state, the gate-source voltage $V_{GS}$ stabilizes at a high value (e.g., 15 volt), and the drain-source voltage $V_{DS}$ reaches a low value $V_{sat}$ (e.g., 1 volt). FIG. 3 further illustrates a spike (also referred to as noise spike, transient disturbance, or random noise) at time $t_3$ in the drain-source voltage $V_{DS}$, which spike may be caused by random perturbations in the power system 100.

At time $t_4$, there is an electrical short in a corresponding high side power switch THx that is coupled to the low side power switch TLx, e.g., in a same half-bridge driver. As a result, the electrical current flowing through the load path terminals of the low side power switch TLx increases from a normal value of, e.g., 800 A, in the ON-state to, e.g., 2000A due to the short circuit. Accordingly, the drain-source voltage $V_{DS}$ of the low side power switch TLx increases from a normal voltage value $V_{sat}$ of, e.g., 1 volt, during the ON-state to a high voltage value of, e.g., greater than 20V.

A desaturation detection circuit detects the short circuit condition by monitoring the drain-source voltage $V_{DS}$ and detecting a high value of the drain-source voltage $V_{DS}$ in the ON-state. For example, the drain-source voltage $V_{DS}$ may be compared with a pre-determined threshold $V_{DESAT}$, which pre-determined threshold $V_{DESAT}$ is higher than the expected value $V_{sat}$ of the drain-source voltage $V_{DS}$ in the ON-state. If the drain-source voltage $V_{DS}$ rises above the threshold $V_{DESAT}$ in the ON-state, the desaturation detection circuit may indicate the detection of a fault condition (e.g., short circuit condition). The detection of the short circuit condition by the desaturation detection circuit may also be referred to as detection of a desaturation condition.

In order to avoid a false alarm, the desaturation detection circuit may be disabled (e.g., turned off) during the OFF-state and during the turn-on process (e.g., between time $t_0$ and time $t_2$) of the power switch, when the drain-source voltage $V_{DS}$ is still high (e.g., above the pre-determined threshold $V_{DESAT}$). The suppression (e.g., disabling) of the desaturation detection circuit during the OFF-state and during the turn-on process is referred to as desaturation blanking. Besides desaturation blanking, additional processing of the measured values for drain-source voltage $V_{DS}$, such as filtering (e.g., lower pass filtering), may be performed to filter out random noises in the drain-source voltage $V_{DS}$. Without the filtering to smooth out (e.g., average out) the random spike in the drain-source voltage $V_{DS}$, false detection of the desaturation condition may result. For example, the random noise in the drain-source voltage $V_{DS}$ at time $t_3$ may cause a false alarm if filtering is not performed properly. The processing (e.g., filtering) to suppress noise in the drain-source voltage $V_{DS}$ is referred to as desaturation filtering. FIG. 3 further illustrates that at time $t_5$, the power switch starts to turn off, e.g., by the controller 102 in response to detection of a desaturation condition.

Figure 4:
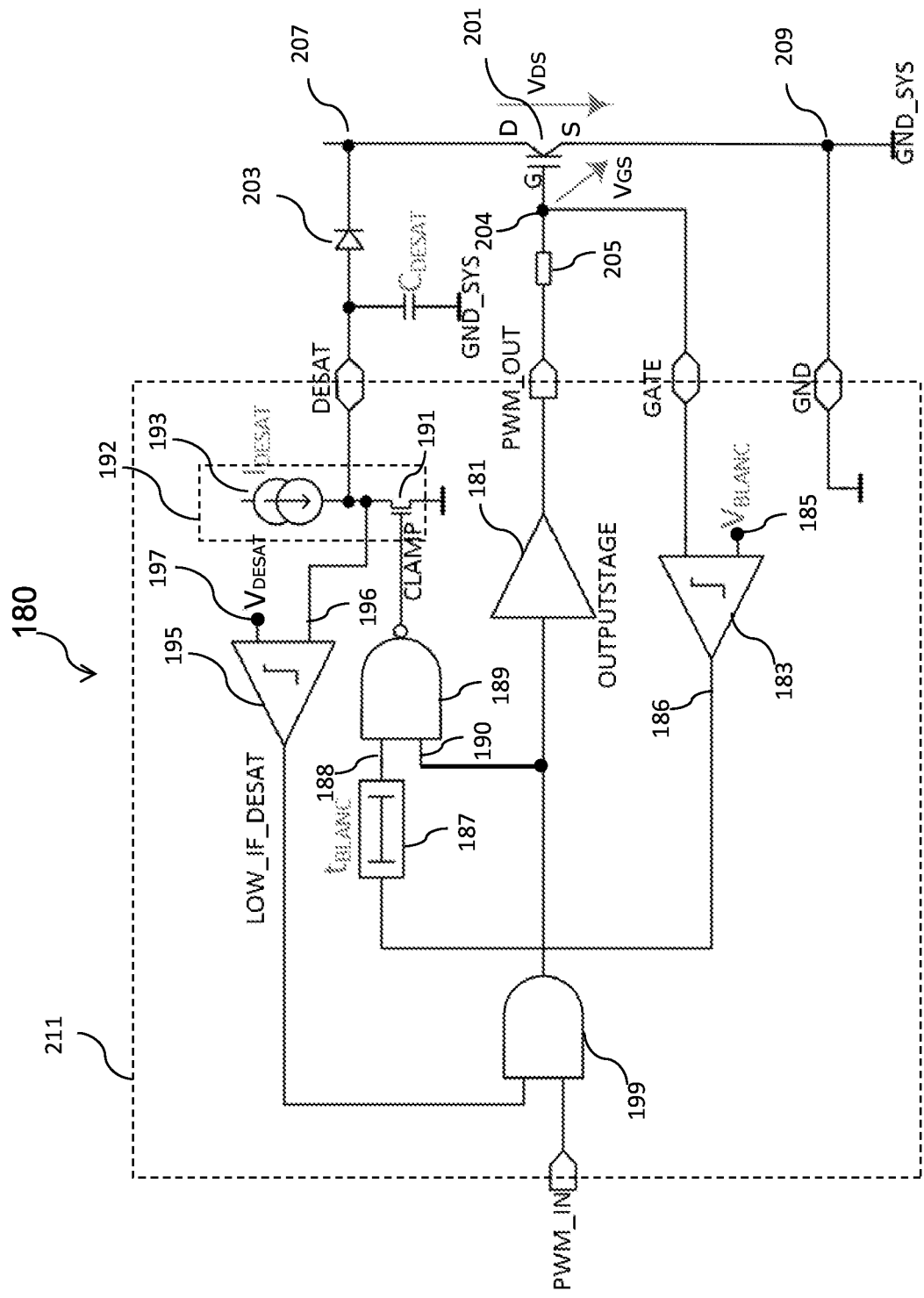
FIG. 4 illustrates a schematic view of a driver circuit, in an embodiment.

FIG. 4 illustrates a schematic view of the driver circuit 180 with a built-in desaturation detection circuit, in an embodiment. In particular, FIG. 4 shows a driver circuit 181 for driving the power switches TH/TL, and the desaturation detection circuit built around the driver circuit 181. Note that, to illustrate operation of the saturation detection circuit, FIG. 4 further illustrates electrical components that are connected to, but are not part of, the driver circuit 180. In particular, electrical component inside the dashed box 211 in FIG. 4 form the driver circuit 180 with a built-in desaturation detection circuit, in some embodiments. The driver circuit 180, as part of the gate driver IC 107, has a plurality of input/output pins, such as a DESAT pin, a PWM_out pin, a GATE pin, a GND pin, and a PWM_IN pin. The driver circuit 180 of FIG. 4 is used three times as the high side driver circuit 180H and used three times as the low side driver circuit 180L in FIG. 2, in some embodiments.

FIG. 4 illustrates some electrical components that are external to the driver circuit 180, such as a power switch 201 with a control terminal 204 (e.g., a gate) electrically coupled to the driver circuit 181 via a resistor 205. The power switch 201 may be a low side power switch TLx, in the example of FIG. 4. The control terminal 204 of the power switch 201 is coupled to the GATE pin. A first load path terminal S (e.g., a source) of the power switch 201 is coupled to a reference voltage node 209 having a reference voltage (e.g., electrical ground), and a second load path terminal D (e.g., a drain) of the power switch 201 is coupled to node 207, which node 207 is coupled to a respective high side power switch THx (not illustrated in FIG. 4, see FIG. 1). FIG. 4 further illustrates a diode 203 coupled between the node 207 and the DESAT pin, and a capacitor $C_{DESAT}$ coupled between the DESAT pin and a reference voltage node (e.g., electrical ground). Although the capacitor $C_{DESAT}$ is illustrated as an external component to the driver circuit 180 in FIG. 4, it may be implemented as an internal component of (thus is part of) the driver circuit 18o, in other embodiments. In FIG. 4, the voltage at the DESAT pin is filtered by a filter circuit comprising the current source $I_{DESAT}$ and the capacitor $C_{DESAT}$ as a non-limiting example. In other embodiments, the filtering of the voltage at the DESAT pin is performed after the comparator 195 (e.g., at the output of the comparator 195) without using a capacitor.

Note that in FIG. 4, the first load path terminal S (e.g., source) of the power switch 201 is coupled to electrical ground. Therefore, for simplicity, in the discussion below regarding desaturation detection, the drain-source voltage $V_{DS}$ and the gate-source voltage $V_{GS}$ may be referred to as the drain voltage and the gate voltage of the power switch 201, respectively. One skilled in the art will ready appreciate that in embodiments where the first load path terminal S of the power switch 201 (e.g., the high side power switch) is not coupled to electrical ground, the drain voltage and the source voltage discussed below in the context of desaturation detection should be interpreted as the drain voltage and the gate voltage relative to the source voltage of the power switch 201.

In the example of FIG. 4, the desaturation detection circuit includes all of the illustrated electrical components inside the dashed box 211 except the driver circuit 181. As illustrated in FIG. 4, the desaturation detection circuit includes a first comparator 183. An input terminal of the first comparator 183 is coupled to the control terminal 204 (e.g., a gate) of the power switch 201 via the GATE pin, and another input terminal of the first comparator 183 is coupled to a reference voltage node 185 having a per-determined reference voltage $V_{BLANC}$.

The reference voltage $V_{BLANC}$ is used as a trigger level (e.g., a voltage trigger level) for starting a timer 187 and has a fixed value, in the illustrated embodiment. In particular, the first comparator 183 is configured to compare the voltage at the control terminal 204 of the power switch 201 with the pre-determined reference voltage $V_{BLANC}$. When the voltage at the control terminal 204 of the power switch 201 rises above (e.g., is greater than) the pre-determined reference voltage $V_{BLANC}$, e.g., during a turn-on process, the output of the first comparator 183 changes (e.g., turns into logic high) to reflect such an event. The pre-determined reference voltage $V_{BLANC}$ may be chosen as a value between, e.g., electrical ground and the Miller voltage $V_{miller}$. For example, the Miller voltage V miller may be between about 5 V and about 6 V, and the pre-determined reference voltage $V_{BLANC}$ may be about 2 V. Note that in the illustrated embodiment, the fixed value of the reference voltage $V_{BLANC}$ is used for different external loads driven by the power switches. In other words, the value of the reference voltage $V_{BLANC}$ remains the same regardless of the external loads. Advantages of using a fixed value for the reference voltage $V_{BLANC}$ are discussed below with reference to FIGS. 5 and 6.

Still referring to FIG. 4, the output terminal 186 of the first comparator 183 is coupled to an input terminal of the timer 187, and may be used as a enable signal to start the timer 187. The timer 187 may be implemented as, e.g., a tapped delay line, or a counter. In some embodiments, the timer 187 is configured to count a pre-determined period of time $t_{BLANC}$ when the first comparator 183 detects that the voltage at the control terminal 204 of the power switch 201 is larger than the pre-determined reference voltage $V_{BLANC}$. The pre-determined period of time $t_{BLANC}$ may be between about 200 ns and about 5 μs, such as about 500 ns. In the illustrated embodiment, a fixed value is used for the pre-determined period of time $t_{BLANC}$ regardless of the external loads driven by the power switches. Advantages of using a fixed value for the pre-determined period of time $t_{BLANC}$ are discussed below with reference to FIGS. 5 and 6.

An output terminal of the timer 187 is coupled to an input terminal of a logic gate 189, and an output terminal of the logic gate 189 is coupled to a clamping circuit 192. Another input terminal 190 of the logic gate 189 is coupled to the output of a logic gate 199 (e.g., an AND gate). In the illustrated embodiment, the logic gate 189 is a NAND gate, and the clamping circuit 192 includes a transistor 191 and a current source 193. The gate of the transistor 191 is coupled to an output terminal of the logic gate 189, a source of the transistor 191 is coupled to a reference voltage node (e.g., electrical ground), and a drain of the transistor 191 is coupled to an input terminal 196 of a second comparator 195. The input terminal 196 of the second comparator 195 is also coupled to the second load path terminal D (e.g., a drain) of the power switch 201 via the DESAT pin and a diode 203. Another input terminal of the second comparator 195 is coupled to a reference voltage node 197 having the pre-determined reference voltage $V_{DESAT}$, which pre-determined reference voltage $V_{DESAT}$ is used to detect the desaturation condition (e.g., electrical short of the power switches), details of which are discussed hereinafter. In the illustrated embodiment, the second comparator 195 is configured to compare the pre-determined reference voltage $V_{DESAT}$ with the voltage at the input terminal 196, and outputs a logic low value if the voltage at the input terminal 196 is higher than the pre-determined reference voltage $V_{DESAT}$. The output terminal of the second comparator 195 is coupled to an input terminal of the logic gate 199 (e.g., an AND gate). Another input terminal of the logic gate 199 is coupled to a gate control signal (e.g., PWM_H or PWM_L) from the controller 102 via the PWM_IN pin. The output terminal of the logic gate 199 is coupled to the driver circuit 181 to control the driver circuit 181.

Operation of the desaturation detection circuit in FIG. 4 is now described. In the example of FIG. 4, the timer 187 has an initial output with a logic low value (e.g., after start up, or after a reset of the power system 100), and is stopped (e.g., not enabled) initially. The power switch 201 is initially turned off, and therefore, the voltage at the node 207 is high (e.g., about 400 V). As discussed in more detail below, the voltage at the DESAT pin is clamped to a low voltage (e.g., electrical ground) by the clamping circuit 192 when the power switch 201 is in the OFF state, and the diode 203 is reversely biased and protects the DESAT pin from the high voltage at the node 207.

During a turn-on process, when the first comparator 183 detects that the voltage at the control terminal 204 of the power switch 201 is larger than the pre-determined reference voltage $V_{BLANC}$, the output of the first comparator 183 turns high, which enables (e.g., starts) the timer 187. In response, the timer 187 starts counting the pre-determined period $t_{BLANC}$, and after the timer 187 expires (e.g., the pre-determined period $t_{BLANC}$ has elapsed), the output of the timer 187 outputs a logic high value.

Note that before the timer 187 expires, the output of the timer 187 is logic low, which results in a logic high value at the output of the logic gate 189 (e.g., a NAND gate). The logic high value at the output of the logic gate 189 turns on transistor 191. Turning on the transistor 191 clamps the voltage at the input terminal 196 of the second comparator 195 to a low voltage (e.g., electrical ground), and therefore, the output of the second comparator 195 is logic high, which allows the gate control signal (e.g., a PWM gate control signal) at the PWM_IN pin to pass the logic gate 199 to control the driver circuit 181. Note that clamping the voltage at the input terminal 196 to electrical ground effectively turns off (e.g., disables) the desaturation detection. Therefore, the desaturation detection is disabled before the timer 187 expires or when the PWM control voltage at the PWM_IN pin is low. In the example of FIG. 4, the desaturation detection is disabled using the clamping circuit 192 as a non-limiting example. In other embodiments, disabling of the desaturation detection is achieved by disabling the output the comparator 195, thus the transistor 191 may not be used.

Still referring to FIG. 4, after the timer 187 expires, the output of the timer 187 turns high, which results in a logic low value at the output of the logic gate 189 since the PWM control voltage at the PWM_IN pin is high during the turn-on process. The logic low value at the output of the logic gate 189 turns off the transistor 191. As a result, the voltage at the input terminal 196 is no longer clamped to electrical ground, and instead, is now substantially equal to (e.g., is a diode's drop above) the voltage at the second load path terminal (e.g., a drain) of the power switch 201. For example, when the power switch 201 is turned on, its drain voltage (e.g., the voltage at the node 207) is about 1V, and the voltage at the DESAT pin (or the input terminal 196) is about 1.7V. The second comparator 195 monitors the voltage at the input terminal 196, and outputs a logic low value to indicate detection of a desaturation condition (e.g., electrical short) when the voltage at the input terminal 196 is larger than the pre-determined threshold $V_{DESAT}$. For example, when the power switch 201 has an electrical short, the voltage at the node 207 may rise to a high value of, e.g., about 100 V, and therefore, the diode 203 is reverse biased, and the current source $I_{DESAT}$ charges the capacitor $C_{DESAT}$ such that the voltage at the DESAT pin may rise to a voltage of, e.g., 22 V. Once the desaturation condition is detected, the logic low value at the output of the second comparator 195 closes the logic gate 199, thereby turning off the driver circuit 181. In some embodiments, the output of the second comparator 195 may be monitored by the controller 102. If a desaturation condition is detected, a safety procedure may be initiated by the controller 102 to prevent damage to the power switch and/or the power system 100. The safety procedure may include a sequence of actions, e.g., to turn off the gate driver IC 107, to turn off the power switches TH/TL, and/or to isolate the power switches TH/TL from the second power supply having the voltage V2 (see FIG. 1).

As discussed above, the voltage at the input terminal 196 of the second comparator 195 may have spikes (e.g., random noises) which may cause false detection of the desaturation condition. The capacitor $C_{DESAT}$ coupled to the input terminal 196 of the second comparator 195 may act as a low pass filter for the voltage at the input terminal 196, since high-frequency components (e.g., the spikes) are discharged toward electrical ground through the capacitor $C_{DESAT}$. In some embodiments, a desaturation filtering time $t_{filt}$ of the equivalent low pass filter formed by the capacitor $C_{DESAT}$ is determined by the capacitance of the capacitor $C_{DESAT}$. Therefore, the capacitance of the capacitor $C_{DESAT}$ may be chosen to achieve a target desaturation filtering time $t_{filt}$ between, e.g., 200 ns and 1000 ns. In some embodiments, the desaturation filtering time $t_{filt}$ is adjusted to accommodate different safety time requirements of power switches (e.g., smaller desaturation filtering time $t_{filt}$ for SiC power switches and larger desaturation filtering time $t_{filt}$ for IGBT power switches).

Figure 5:
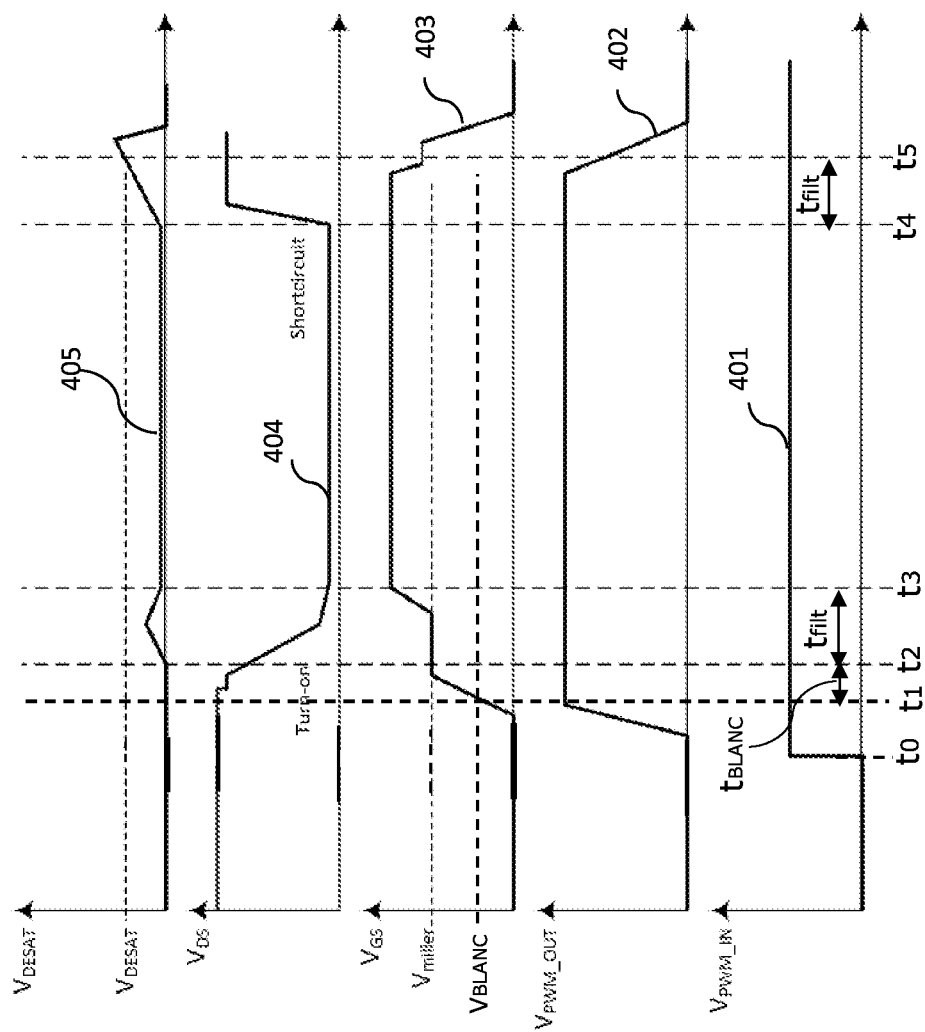
FIG. 5 illustrates responses of various signals in a power system during a desaturation detection process using the desaturation detection circuit of FIG. 4, in an embodiment.

FIG. 5 illustrates responses of various signals in the power system 100 during a desaturation detection process using the desaturation circuit of FIG. 4, in an embodiment. In FIG. 5, signal 401 illustrates the PWM gate control signal (e.g., at the PWM_IN pin of FIG. 4) from the controller 102. For example, a rising edge of the signal 401 indicates that the controller 102 is sending a gate control signal to turn on the power switch 201. Signal 402 shows the PWM gate control signal after it propagates to the PWM_OUT pin in FIG. 4. Signal 403 and signal 404 illustrate the gate-source voltage $V_{GS}$ and the drain-source voltage $V_{DS}$ of the power switch 201, respectively. Details of the gate-source voltage $V_{GS}$ and the drain-source voltage $V_{DS}$ are discussed in FIG. 3, thus not repeated here. Signal 405 shows the voltage at the input terminal 196 of the second comparator 195. Note that in FIGS. 3, 5, and 6, time labels such as T1, T2, T3, T4 and T5 are used to denote different time instants within the figure. The same time label in one figure may not necessarily correspond to the same time label in a different figure.

As illustrated in FIG. 5, the rising edge of the PWM control signal arrives at time $t_0$. The timer 187, however, is not enabled until time $t_1$, when the gate-source voltage $V_{GS}$ rises above the pre-determined threshold $V_{BLANC}$. The timer 187 finishes counting the pre-determined period of time $t_{BLANC}$ at time $t_2$. The clamping circuit 192 is disable at time $t_2$, thereby allowing the second comparator 195 to start monitoring the voltage at the input terminal 196, which is substantially equal to a smoothed (e.g., filtered) version of the voltage at the second load path terminal D (e.g., drain) of the power switch 201. FIG. 5 shows a small voltage spike in the signal 405 between time $t_2$ and time $t_3$, due to the filtering effect of the capacitor $C_{DESAT}$ on the drain-source voltage $V_{DS}$ during the turn-on process. The small voltage spike, however, is below the threshold $V_{DESAT}$, therefore not causing a false alarm. At time $t_4$, a short circuit condition happens, and the drain-source voltage $V_{DS}$ increases. At time $t_5$, the voltage at the input terminal 196 of the second comparator 195 rises above the threshold $V_{DESAT}$, which causes the output of the second comparator 195 to turn into, e.g., a logic low value, to indicate detection of the fault condition.

Note that the disclosed desaturation detection circuit starts the timer 187 not at the rising edge (e.g., time $t_0$) of the PWM gate control signal, but at a time (e.g., $t_1$) when the gate-source voltage $V_{GS}$ rises above the pre-determined threshold $V_{BLANC}$. This has the effect of automatically adjusting the starting time of the timer 187 for different applications or different external loads, since the rate at which the gate-source voltage $V_{GS}$ rises depends on various factors, such as the board design, the type of the external load driven by the power switches, and the parameters of the external loads.

Figure 6:
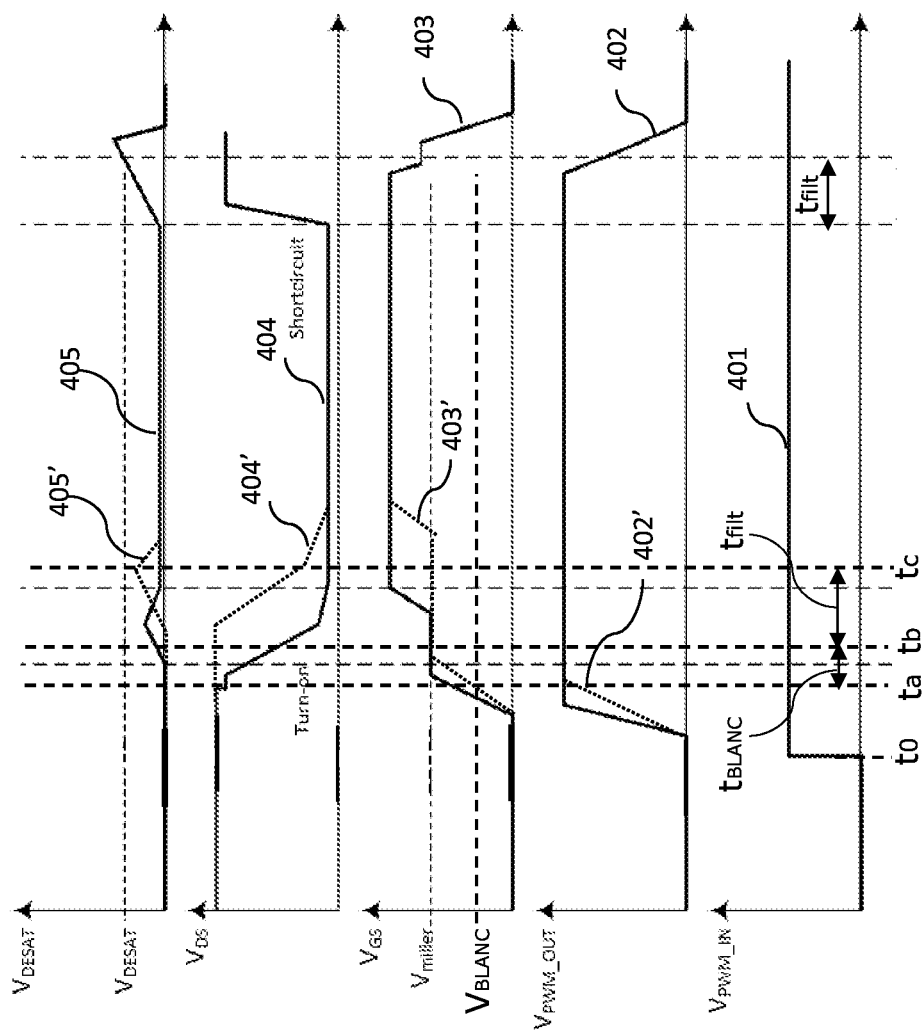
FIG. 6 illustrates responses of various signals in a power system during a desaturation detection process using the desaturation detection circuit of FIG. 4, in another embodiment.

To illustrate the automatic adjustment of the starting time of the timer 187, FIG. 6 illustrates the responses of the various signals illustrated in FIG. 5, but with a different external load. In particular, the responses of the various signals with the different external load are illustrated in dashed lines and labeled with numerals 402', 403', 404', and 405', which corresponds to the signals 402, 403, 404, and 405 in FIG. 5. For comparison, the signal 402, 403, 404, and 405 in FIG. 5 are also plotted in FIG. 6. The signal 403' shows that the gate-source voltage $V_{DS}$ of the power switch with the different load rises slower than the signal 403. Accordingly, the starting time for the timer 187 is automatically delayed to time $t_0$ (instead of time $t_1$ in FIG. 5). Similarly, the stopping time for the timer 187 is delayed to time $t_b$.

The automatic adjustment of the starting time of the timer 187 allows a fixed pre-determined threshold $V_{BLANC}$ and a fixed pre-determined duration $t_{BLANC}$ to be used in the desaturation detection circuit, without causing performance issues such as increased false alarm rate. Note that the first comparator 183 maximizes the benefit of automatic adjustment of the starting time by monitoring the voltage at the control terminal 204 of the power switch 201 instead of the voltage at the PWM_OUT pin, since the voltage at the control terminal 204 is closer to the external load and is affected more by the external load conditions.

To appreciate the advantages of the presently disclosed desaturation detection circuit and method, consider the following two reference methods. The first reference method uses the rising edge of the PWM gate control signal to start the timer 187 and has a fixed blanking time $t_{BLANC}$. However, to cover different load conditions and to avoid false alarm during the turn-on process, the first reference method may require a very long $t_{BLANC}$ time, which may slow down the reaction time of the desaturation detection circuit, and may not be able to detect desaturation conditions happening close to the rising edge of the PW gate control signal.

The second reference method still uses the rising edge of the PWM gate control signal to start the timer 187, but the pre-determined threshold $V_{BLANC}$ and/or the pre-determined duration $t_{BLANC}$ are made programmable to handle different load conditions. However, making the pre-determined threshold $V_{BLANC}$ and/or the pre-determined duration $t_{BLANC}$ programmable increases the complexity of the gate driver IC, and may require more input/output pins to accommodate the programmability. This not only increases area/cost of the gate driver IC, but also increases the burden of software development, since the software developer needs to determine the values for the programmable $t_{BLANC}$ and $V_{BLANC}$ for different load conditions or system configurations. For mission critical applications such as automobile applications, each version of the software with different $t_{BLANC}$ and $V_{BLANC}$ values may need to go through a certification process to be certified, thus having programmable $t_{BLANC}$ and $V_{BLANC}$ may be a huge burden for the software development of the gate driver IC.

Some embodiments of the disclosed desaturation circuit and method allow the same fixed pre-determined threshold $V_{BLANC}$ and the pre-determined duration $t_{BLANC}$ to be used for different applications, thus lowering the system complexity and the pin count of the gate driver IC, thus reducing the cost of the gate driver IC. Note that the GATE pin (see FIG. 4), which is already available in many driver ICs for clamping the miller capacitor of IGBT after the switch off event (Active-Miller-Clamping), is now used to sense the gate voltage of the power switch 201, thus no extra GATE pin is needed for the desaturation detection circuit. In addition, if the threshold $V_{BLANC}$ is set to the same voltage as the trigger voltage of Active-Miller-Clamping, the first comparator 183 may be shared with the comparator used for Active-Miller-Clamping, thus no additional comparator is needed for the desaturation detection circuit. Furthermore, the software development effort (e.g., for the gate driver IC) is greatly simplified since the values for the threshold $V_{BLANC}$ and the duration $t_{BLANC}$ are fixed.

Variations to the disclosed embodiments are possible and are fully intended to be included within the scope of the present disclosure. For example, the logic gates (e.g., 199, 189) in FIG. 4 may be changed with other combinations of logic gates to achieve the same control purpose. As another example, the clamping circuit 192 may be implemented in different ways but to achieve the same functionalities, such as clamping the voltage at the input terminal 196 of the second comparator 195 to electrical ground during desaturation blanking time, and be disabled after the desaturation blanking time has elapsed.

Figure 7:
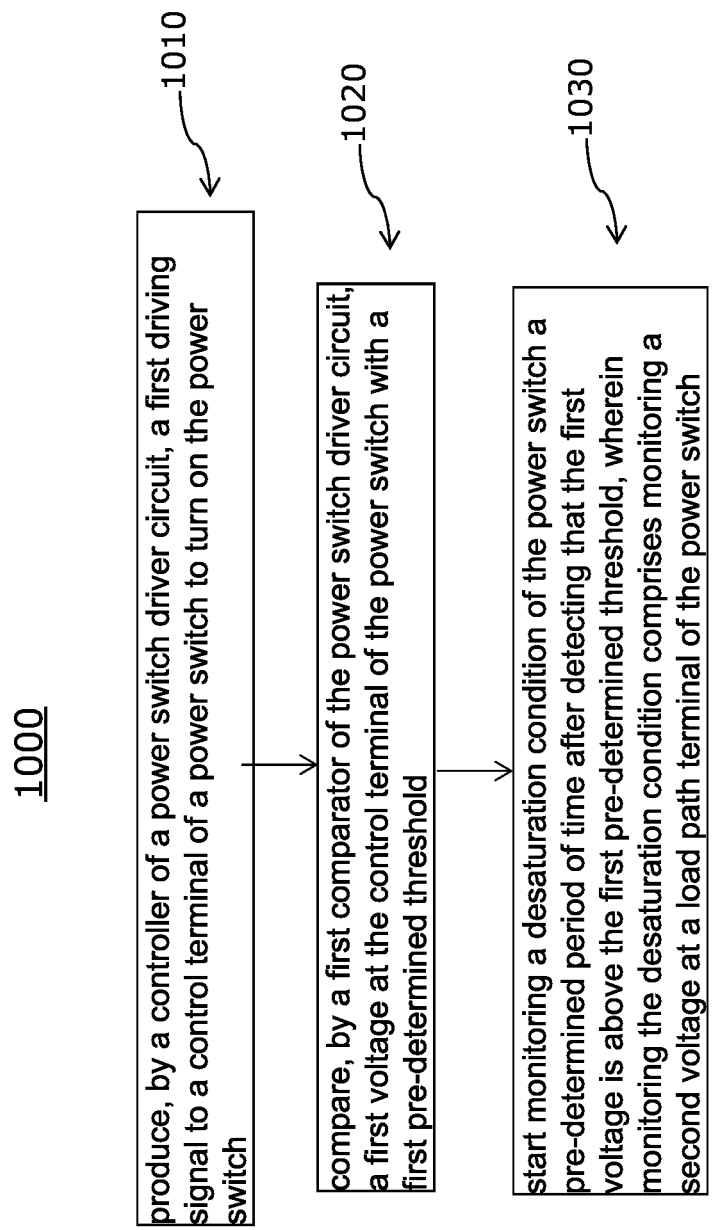
FIG. 7 is a flow chart for a method of operating a gate driver circuit coupled to a power switch, in some embodiments.

FIG. 7 illustrates a flow chart of a method 2000 of operating a gate driver circuit coupled to a power switch, in accordance with some embodiments. It should be understood that the embodiment method shown in FIG. 7 is merely an example of many possible embodiment methods. One of ordinary skill in the art would recognize many variations, alternatives, and modifications. For example, various steps as illustrated in FIG. 7 may be added, removed, replaced, rearranged and repeated.

Referring to FIG. 7, at step 1010, a controller of a power switch driver circuit produces a first driving signal to a control terminal of a power switch to turn on the power switch. At step 1020, a first comparator of the power switch driver circuit compares a first voltage at the control terminal of the power switch with a first pre-determined threshold. At step 1030, monitoring of a desaturation condition of the power switch is started a pre-determined period of time after detecting that the first voltage is above the first pre-determined threshold, wherein monitoring the desaturation condition comprises monitoring a second voltage at a load path terminal of the power switch.

Example embodiments of the present invention are summarized here. Other embodiments can also be understood from the entirety of the specification and the claims filed herein.

Example 1

In an embodiment, a method of operating a power switch driver circuit coupled to a power switch includes producing, by a controller of the power switch driver circuit, a first driving signal to a control terminal of the power switch to turn on the power switch; comparing, by a first comparator of the power switch driver circuit, a first voltage at the control terminal of the power switch with a first pre-determined threshold; and starting monitoring a desaturation condition of the power switch a pre-determined period of time after detecting that the first voltage is above the first pre-determined threshold, wherein monitoring the desaturation condition comprises monitoring a second voltage at a load path terminal of the power switch.

Example 2

The method of example 1, wherein monitoring the second voltage at the load path terminal of the power switch comprises comparing, by a second comparator of the power switch driver circuit, the second voltage at the load path terminal with a second pre-determined threshold.

Example 3

The method of example 2, further comprising, in response to detecting that the second voltage at the load path terminal is above the second pre-determined threshold, turning off the power switch.

Example 4

The method of example 2, further comprising, in response to detecting that the second voltage at the load path terminal is above the second pre-determined threshold, outputting, by the second comparator of the power switch driver circuit, a signal to indicate a fault condition.

Example 5

The method of example 4, further comprising, initiating a safety procedure to prevent damage to the power switch after outputting the signal indicating the fault condition.

Example 6

The method of example 2, wherein comparing, by the second comparator of the power switch driver circuit, the second voltage at the load path terminal with the second pre-determined threshold comprises: coupling a first input terminal of the second comparator to a reference voltage having the second pre-determined threshold; and coupling a second input terminal of the second comparator to the load path terminal of the power switch.

Example 7

The method of example 6, further comprising: before the pre-determined period of time has elapsed, clamping a voltage at the second input terminal of the second comparator to electrical ground.

Example 8

The method of example 7, wherein comparing, by the second comparator of the power switch driver circuit, the second voltage at the load path terminal with the second pre-determined threshold further comprises: filtering the second voltage using a capacitor, wherein a desaturation detection filtering time is based on a capacitance of the capacitor.

Example 9

The method of example 7, further comprising, supplying a current to the second input terminal of the second comparator using a current source.

Example 10

The method of example 1, wherein the first pre-determined threshold has a first fixed value that is used for different external loads driven by the power switch.

Example 11

The method of example 10, wherein the pre-determined period of time has a second fixed value that is used for the different external loads driven by the power switch.

Example 12

In an embodiment, a power switch driver circuit includes a driver circuit configured to be coupled to a control terminal of a power switch and drive the power switch; and a desaturation detection circuit coupled to the driver circuit, the desaturation detection circuit comprising: a first comparator configured to compare a first reference voltage with a first voltage at the control terminal of the power switch; and a timer coupled to the first comparator and configured to start counting a pre-determined period of time when the first comparator detects that the first voltage is above the first reference voltage, wherein the desaturation detection circuit is configured to detect a desaturation condition of the power switch, wherein the desaturation detection circuit is further configured to be disabled before the timer finishes counting the pre-determined period of time and enabled after the timer finishes counting the pre-determined period of time.

Example 13

The power switch driver circuit of example 12, wherein the desaturation detection circuit further comprises: a second comparator configured to compare a second reference voltage with a second voltage at a first input terminal of the second comparator; and a clamping circuit coupled to the first input terminal of the second comparator and configured to clamp the second voltage at the first input terminal of the second comparator to a third reference voltage lower than the second reference voltage before the timer finishes counting the pre-determined period of time, wherein the timer is further configured to disable the clamping circuit after the timer finishes counting the pre-determined period of time such that the second voltage at the first input terminal of the second comparator is substantially equal to a voltage at a load path terminal of the power switch.

Example 14

The power switch driver circuit of example 13, wherein the second comparator is configured to detect that the voltage at the load path terminal of the power switch is above the second reference voltage.

Example 15

The power switch driver circuit of example 14, wherein the driver circuit is configured to be disabled when the second comparator detects that the voltage at the load path terminal of the power switch is above the second reference voltage.

Example 16

The power switch driver circuit of example 14, further comprising a logic gate, wherein a first input terminal of the logic gate is coupled to an output terminal of the second comparator, a second input terminal of the logic gate is coupled to a controller of the power switch driver circuit, and an output terminal of the logic gate is coupled to the driver circuit.

Example 17

The power switch driver circuit of example 13, wherein the clamping circuit comprises: a transistor, wherein a gate of the transistor is coupled to the timer, a first load path terminal of the transistor is coupled to the first input terminal of the second comparator, and a second load path terminal of the transistor is coupled to a third reference voltage node configured to receive the third reference voltage; and a current source coupled to the first input terminal of the second comparator.

Example 18

The power switch driver circuit of example 13, further comprising: a diode coupled between the first input terminal of the second comparator and the load path terminal of the power switch; and a capacitor coupled between the first input terminal of the second comparator and a third reference voltage node configured to receive the third reference voltage.

Example 19

The power switch driver circuit of example 12, wherein the first reference voltage and the pre-determined period of time are constant for different types of external loads connected to the power switch.

Example 20

In an embodiment, a gate driver integrated circuit includes a driver circuit having an output terminal configured to be coupled to a control terminal of a power switch; a first comparator having a first input terminal configured to be coupled to the control terminal of the power switch, and a second input terminal coupled to a first reference voltage node configured to receive a first reference voltage; a timer coupled to an output terminal of the first comparator and configured to count a pre-determined duration when a voltage at the control terminal of the power switch is above the first reference voltage; a second comparator having a first input terminal coupled to a second reference voltage node configured to receive a second reference voltage, and a second input terminal configured to be coupled to a load path terminal of the power switch; and a clamping circuit coupled to the second input terminal of the second comparator.

Example 21

The gate driver integrated circuit of example 20, wherein the clamping circuit comprises: a transistor coupled between the second input terminal of the second comparator and a third reference voltage node configured to receive a third reference voltage lower than the second reference voltage, wherein a gate of the transistor is coupled to an output terminal of the timer; and a current source coupled to the second input terminal of the second comparator.

Example 22

The gate driver integrated circuit of example 21, wherein the second input terminal of the second comparator is configured to be coupled to the load path terminal of the power switch through a diode and a capacitor, wherein the diode is configured to be coupled between the second input terminal of the second comparator and the load path terminal of the power switch, and the capacitor is configured to be coupled between the second input terminal of the second comparator and the third reference voltage node.

While this invention has been described with reference to illustrative embodiments, this description is not intended to be construed in a limiting sense. Various modifications and combinations of the illustrative embodiments, as well as other embodiments of the invention, will be apparent to persons skilled in the art upon reference to the description. It is therefore intended that the appended claims encompass any such modifications or embodiments.

What is claimed is:

1. A method of operating a power switch driver circuit coupled to a power switch, the method comprising:
producing, by a controller of the power switch driver circuit, a first driving signal to a control terminal of the power switch to turn on the power switch;
comparing, by a first comparator of the power switch driver circuit, a first voltage at the control terminal of the power switch with a first pre-determined threshold; and
starting monitoring a desaturation condition of the power switch a pre-determined period of time after detecting that the first voltage is above the first pre-determined threshold, wherein monitoring the desaturation condition comprises monitoring a second voltage at a load path terminal of the power switch.

2. The method of claim 1, wherein monitoring the second voltage at the load path terminal of the power switch comprises comparing, by a second comparator of the power switch driver circuit, the second voltage at the load path terminal with a second pre-determined threshold.

3. The method of claim 2, further comprising:
in response to detecting that the second voltage at the load path terminal is above the second pre-determined threshold, turning off the power switch.

4. The method of claim 2, further comprising:
in response to detecting that the second voltage at the load path terminal is above the second pre-determined threshold, outputting, by the second comparator of the power switch driver circuit, a signal to indicate a fault condition.

5. The method of claim 4, further comprising initiating a safety procedure to prevent damage to the power switch after outputting the signal indicating the fault condition.

6. The method of claim 2, wherein comparing, by the second comparator of the power switch driver circuit, the second voltage at the load path terminal with the second pre-determined threshold comprises:
coupling a first input terminal of the second comparator to a reference voltage having the second pre-determined threshold; and
coupling a second input terminal of the second comparator to the load path terminal of the power switch.

7. The method of claim 6, further comprising:
before the pre-determined period of time has elapsed, clamping a voltage at the second input terminal of the second comparator to electrical ground.

8. The method of claim 7, wherein comparing, by the second comparator of the power switch driver circuit, the second voltage at the load path terminal with the second pre-determined threshold further comprises:
filtering the second voltage using a capacitor, wherein a desaturation detection filtering time is based on a capacitance of the capacitor.

9. The method of claim 7, further comprising:
supplying a current to the second input terminal of the second comparator using a current source.

10. The method of claim 1, wherein the first pre-determined threshold has a first fixed value that is used for different external loads driven by the power switch.

11. The method of claim 10, wherein the pre-determined period of time has a second fixed value that is used for the different external loads driven by the power switch.

12. A power switch driver circuit comprising:
a driver circuit configured to be coupled to a control terminal of a power switch and drive the power switch; and
a desaturation detection circuit coupled to the driver circuit, the desaturation detection circuit comprising:
a first comparator configured to compare a first reference voltage with a first voltage at the control terminal of the power switch; and
a timer coupled to the first comparator and configured to start counting a pre-determined period of time when the first comparator detects that the first voltage is above the first reference voltage,
wherein the desaturation detection circuit is configured to detect a desaturation condition of the power switch, wherein the desaturation detection circuit is further configured to be disabled before the timer finishes counting the pre-determined period of time and enabled after the timer finishes counting the pre-determined period of time.

13. The power switch driver circuit of claim 12, wherein the desaturation detection circuit further comprises:
a second comparator configured to compare a second reference voltage with a second voltage at a first input terminal of the second comparator; and
a clamping circuit coupled to the first input terminal of the second comparator and configured to clamp the second voltage at the first input terminal of the second comparator to a third reference voltage lower than the second reference voltage before the timer finishes counting the pre-determined period of time,
wherein the timer is further configured to disable the clamping circuit after the timer finishes counting the pre-determined period of time such that the second voltage at the first input terminal of the second comparator is substantially equal to a voltage at a load path terminal of the power switch.

14. The power switch driver circuit of claim 13, wherein the second comparator is configured to detect that the voltage at the load path terminal of the power switch is above the second reference voltage.

15. The power switch driver circuit of claim 14, wherein the driver circuit is configured to be disabled when the second comparator detects that the voltage at the load path terminal of the power switch is above the second reference voltage.

16. The power switch driver circuit of claim 14, further comprising a logic gate, wherein a first input terminal of the logic gate is coupled to an output terminal of the second comparator, a second input terminal of the logic gate is coupled to a controller of the power switch driver circuit, and an output terminal of the logic gate is coupled to the driver circuit.

17. The power switch driver circuit of claim 13, wherein the clamping circuit comprises:
   a transistor, wherein a gate of the transistor is coupled to the timer, a first load path terminal of the transistor is coupled to the first input terminal of the second comparator, and a second load path terminal of the transistor is coupled to a third reference voltage node configured to receive the third reference voltage; and
   a current source coupled to the first input terminal of the second comparator.

18. The power switch driver circuit of claim 13, further comprising:
   a diode coupled between the first input terminal of the second comparator and the load path terminal of the power switch; and
   a capacitor coupled between the first input terminal of the second comparator and a third reference voltage node configured to receive the third reference voltage.

19. The power switch driver circuit of claim 12, wherein the first reference voltage and the pre-determined period of time are constant for different types of external loads connected to the power switch.

20. A gate driver integrated circuit comprising:
   a driver circuit having an output terminal configured to be coupled to a control terminal of a power switch;
   a first comparator having a first input terminal configured to be coupled to the control terminal of the power switch, and a second input terminal coupled to a first reference voltage node configured to receive a first reference voltage;
   a timer coupled to an output terminal of the first comparator and configured to count a pre-determined duration when a voltage at the control terminal of the power switch is above the first reference voltage;
   a second comparator having a first input terminal coupled to a second reference voltage node configured to receive a second reference voltage, and a second input terminal configured to be coupled to a load path terminal of the power switch; and
   a clamping circuit coupled to the second input terminal of the second comparator.

21. The gate driver integrated circuit of claim 20, wherein the clamping circuit comprises:
   a transistor coupled between the second input terminal of the second comparator and a third reference voltage node configured to receive a third reference voltage lower than the second reference voltage, wherein a gate of the transistor is coupled to an output terminal of the timer; and
   a current source coupled to the second input terminal of the second comparator.

22. The gate driver integrated circuit of claim 21, wherein the second input terminal of the second comparator is configured to be coupled to the load path terminal of the power switch through a diode and a capacitor, wherein the diode is configured to be coupled between the second input terminal of the second comparator and the load path terminal of the power switch, and the capacitor is configured to be coupled between the second input terminal of the second comparator and the third reference voltage node.

* * * * *